(12) United States Patent
Lin

(10) Patent No.: US 9,653,660 B1
(45) Date of Patent: May 16, 2017

(54) CHIP SCALE LED PACKAGING METHOD

(71) Applicant: Shu-Hung Lin, Hsinchu (TW)

(72) Inventor: Shu-Hung Lin, Hsinchu (TW)

( * ) Notice: Subject to any disclaimer, the term of this patent is extended or adjusted under 35 U.S.C. 154(b) by 0 days.

(21) Appl. No.: 15/197,797

(22) Filed: Jun. 30, 2016

(51) Int. Cl.
| | | |
|---|---|---|
| *H01L 33/52* | (2010.01) | |
| *H01L 33/48* | (2010.01) | |
| *H01L 21/56* | (2006.01) | |
| *H01L 23/31* | (2006.01) | |
| *H01L 21/78* | (2006.01) | |

(52) U.S. Cl.
CPC ............ *H01L 33/52* (2013.01); *H01L 21/561* (2013.01); *H01L 21/568* (2013.01); *H01L 23/3185* (2013.01); *H01L 33/48* (2013.01); *H01L 21/78* (2013.01); *H01L 2933/005* (2013.01); *H01L 2933/0033* (2013.01)

(58) Field of Classification Search
None
See application file for complete search history.

(56) References Cited

U.S. PATENT DOCUMENTS

| | | | | |
|---|---|---|---|---|
| 6,020,218 A | * | 2/2000 | Shim ................. | H01L 21/565 257/E21.504 |
| 2003/0155639 A1 | * | 8/2003 | Nakamura ............ | H01L 25/167 257/680 |
| 2009/0176336 A1 | * | 7/2009 | Takahashi ............. | H01L 21/561 438/127 |
| 2012/0043573 A1 | * | 2/2012 | Mitsuishi ........... | C09K 11/0883 257/98 |
| 2012/0142124 A1 | * | 6/2012 | Yoo ......................... | H01L 33/50 438/16 |
| 2016/0293815 A1 | * | 10/2016 | Choi ....................... | H01L 33/60 |

* cited by examiner

*Primary Examiner* — Andres Munoz
(74) *Attorney, Agent, or Firm* — Leong C. Lei

(57) ABSTRACT

A chip scale LED packaging method includes the following steps: clamping an upper mold with a plurality of through holes and a plate-shaped lower mold together; allowing bottoms of the plurality of through holes of the upper mold to be sealed by the plate-shaped lower mold to form a pattern of a plurality of grooves; placing chips one by one in corresponding through holes of the plurality of through holes; pouring encapsulation gel into each of the corresponding through holes; separating the upper mold from the plate-shaped lower mold after the encapsulation gel is cured and molded; and separating each cured and molded encapsulation gel from each of the corresponding through holes of the upper mold and taking each cured and molded encapsulation gel out of the upper mold to obtain an individual chip scale LED package.

1 Claim, 6 Drawing Sheets

CHIP SCALE LED PACKAGING METHOD

(a) TECHNICAL FIELD OF THE INVENTION

The present invention relates to a light emitting diode (LED) packaging technology, and more particularly to a chip scale LED packaging method.

(b) DESCRIPTION OF THE PRIOR ART

As everyone knows, global warming is becoming more and more serious such that energy saving and carbon reduction has become a topic advocated by all countries in the world in recent years, allowing a variety of environmentally friendly products conforming to energy-saving and carbon reduction to be taken seriously gradually. Among them, LED is a good example.

The so-called "chip class package" is the size of an encapsulation gel covering around a chip being very close to the size of the chip; it is defined generally as a packaging size being not more than 20% of the size of a chip. A conventional chip scale packaging process, as shown in FIG. 1, mainly includes the following steps: laying a layer of fixing film for fixation of LED chips 30 onto a carrier board 60; distributing a number of LED chips 30 in an array pattern on the surface of the fixing film, a gap being kept between two adjacent LED chips 30 for subsequent cutting; covering a layer of encapsulation gel on the array of LED chips 30; curing the encapsulation gel 40 by baking; cutting the array of the LED chips 30 into individual chip scale LED packaging bodies 50; and taking the individual chip scale LED packaging bodies 50 down from the fixing film.

However, the conventional chip scale packaging processes have the following disadvantages:

1. the array arrangement of the chips 30, as FIG. 2 shows, should not have any angular deviation upon the process; namely, the high precision is required, resulting in reduced production efficiency.
2. the position offset of the chip 30 must be smaller than 20 um; if the chip 30 is moved, a subsequent patch (surface mount technology, SMT) cannot be used.
3. the array arrangement and cutting (indicated by cutting lines L in FIGS. 3 and 4) must be aligned precisely; if the positioning is not good, or the blade or the chip fixing position is skew, it will cause a bad cutting, resulting in a low cutting yield to form a high scrap rate.
4. the thickness of the encapsulation gel 40 is not easy to be controlled even if it is the key to affect a color temperature quality.
5. the cut individual chip scale LED packaging body 50 can only be square or rectangular. However, individual single light sources should have a variety of shape designs to meet market use requirements so as to match secondary optics to conform to lamp requirements.

SUMMARY OF THE INVENTION

The present invention proposes a chip scale LED packaging method, including the following steps: clamping an upper mold with a plurality of through holes and a plate-shaped lower mold together; allowing bottoms of the plurality of through holes of the upper mold to be sealed by the plate-shaped lower mold to form a pattern of a plurality of grooves; placing chips one by one in corresponding through holes of the plurality of through holes; pouring encapsulation gel into each of the corresponding through holes; separating the upper mold from the plate-shaped lower mold after the encapsulation gel is cured and molded; and separating each cured and molded encapsulation gel from each of the corresponding through holes of the upper mold and taking each cured and molded encapsulation gel out of the upper mold to obtain an individual chip scale LED package. The method can achieve accurate processing, the facilities are simple and production efficiency is high without any loss resulting from cutting such that it is suitable for mass production to meet the requirement of a large number of light sources in the market.

BRIEF DESCRIPTION OF THE DRAWINGS

FIG. 11 is a top view of the molds of the present invention after encapsulation gel is poured in;

FIG. 12 is a cross-sectional view of the molds of the present invention after encapsulation gel is poured in;

DETAILED DESCRIPTION OF THE PREFERRED EMBODIMENTS

Figure 1:
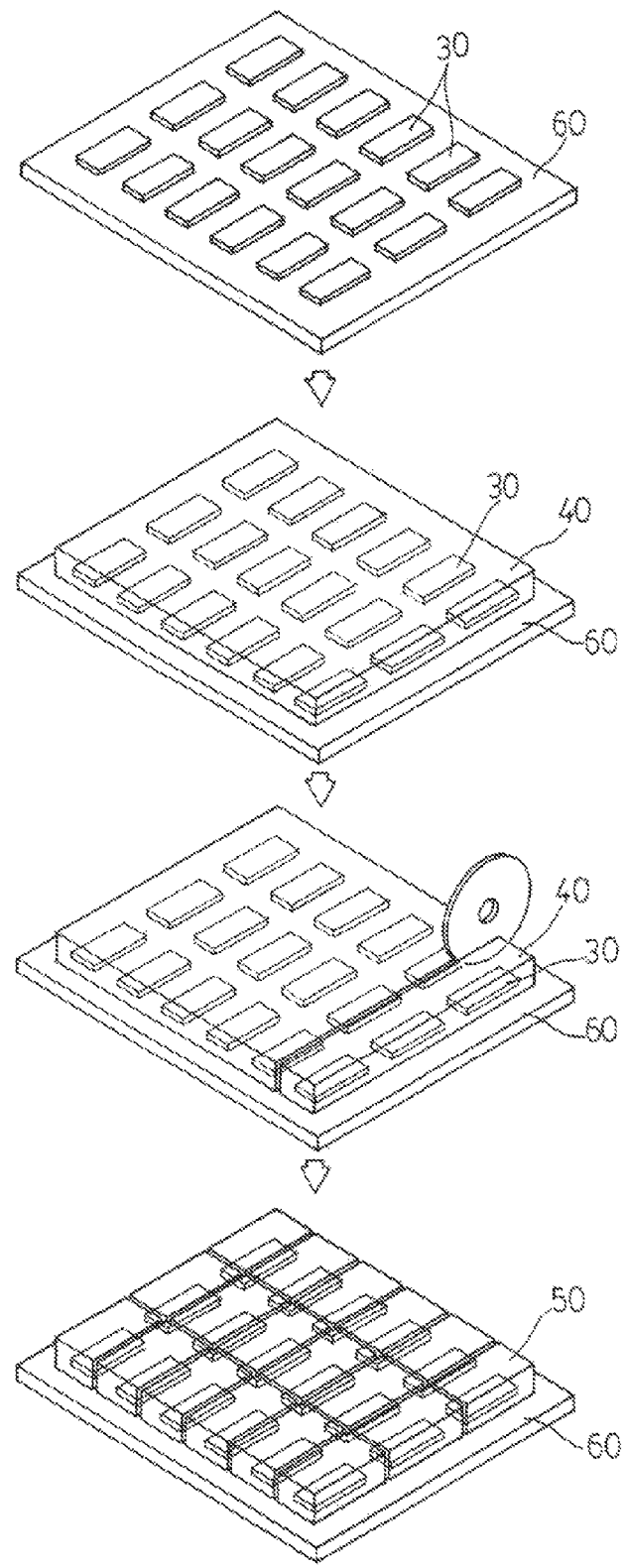
FIG. 1 is a schematic view of a conventional chip scale LED packing equipment and process.
Figure 2:
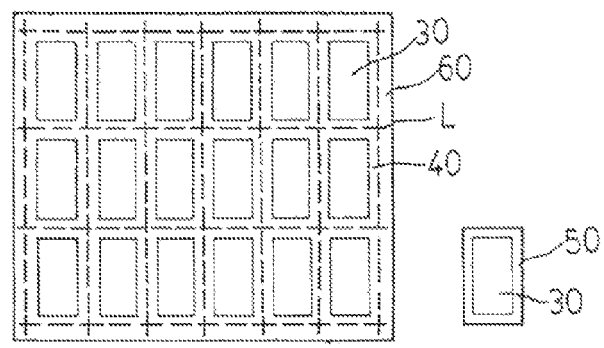
FIGS. 2 to 4 are schematic views of arrangement and cutting conditions of chips involved in the conventional chip scale LED packaging process.
Figure 3:
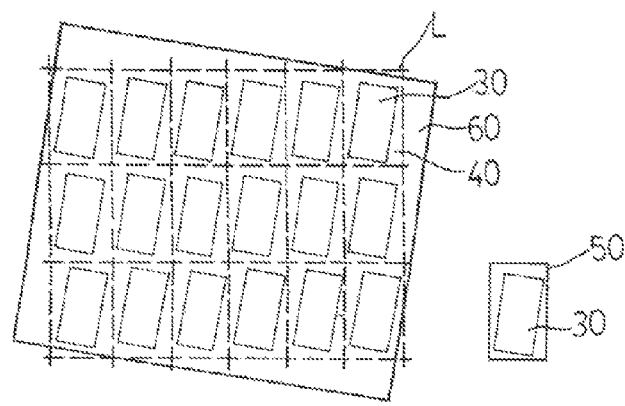
Figure 4:
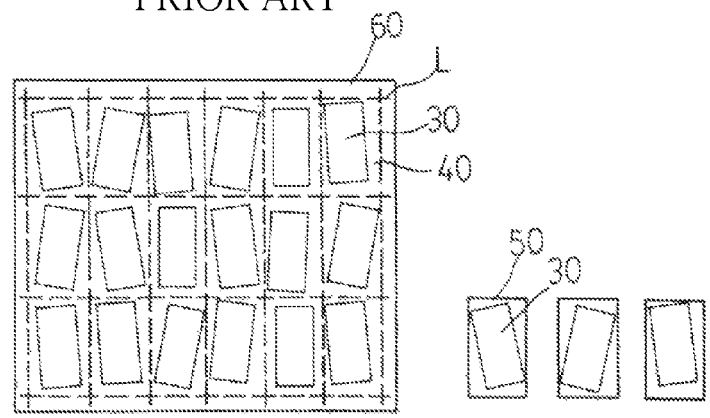
Figure 5:
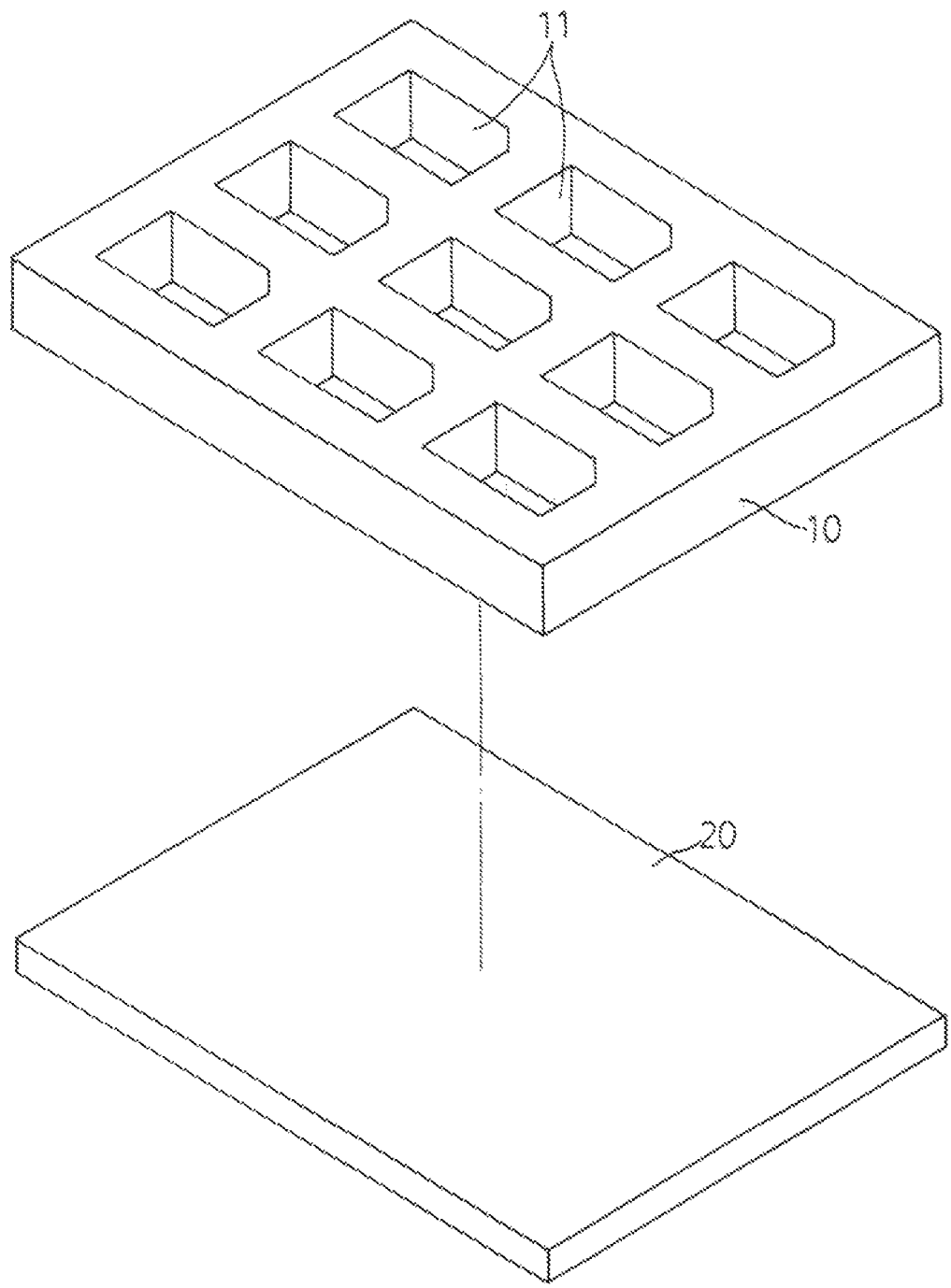
FIG. 5 is a schematically perspective view of molds used according to the present invention.
Figure 6:
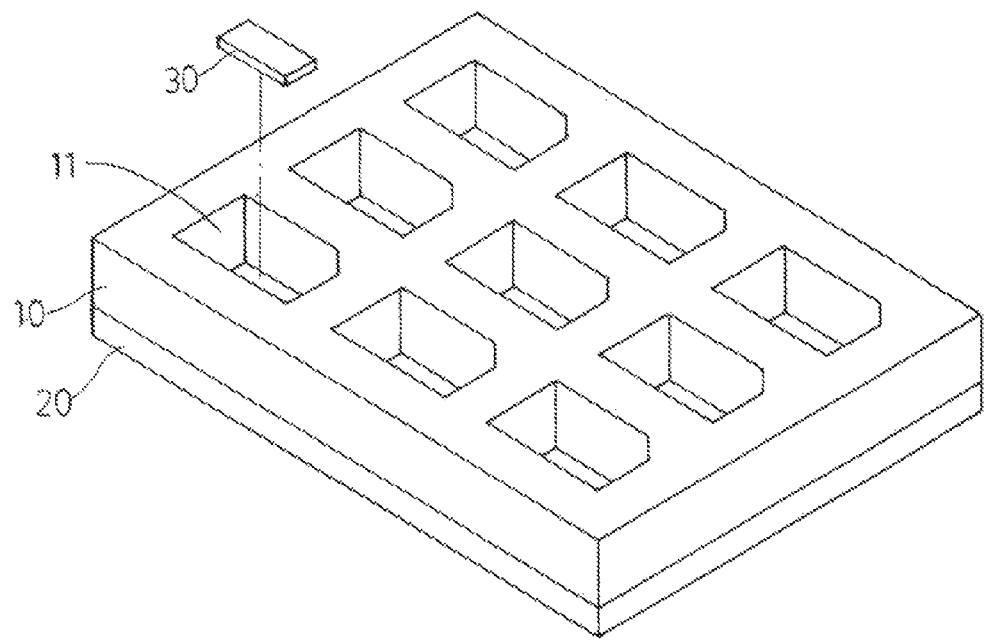
FIG. 6 is a schematically perspective view of the molds used according to the present invention while being combined together.
Figure 7:
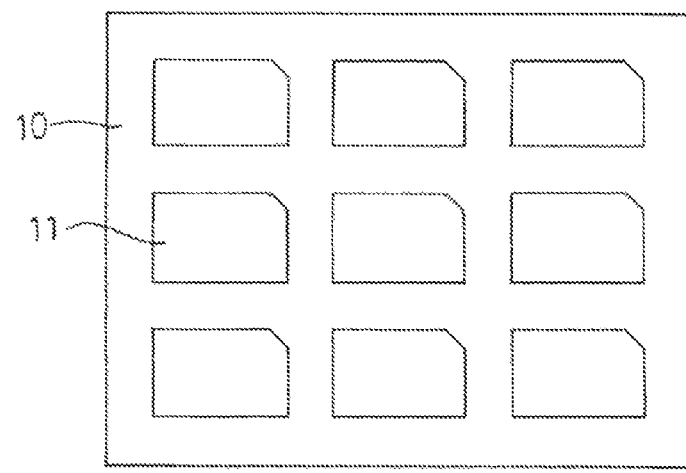
FIG. 7 is a top view of the molds used according to the present invention.
Figure 8:
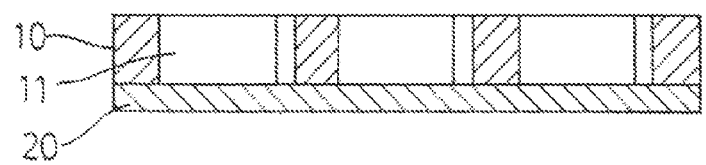
FIG. 8 is a cross-sectional view of the molds used according to the present invention.
Figure 9:
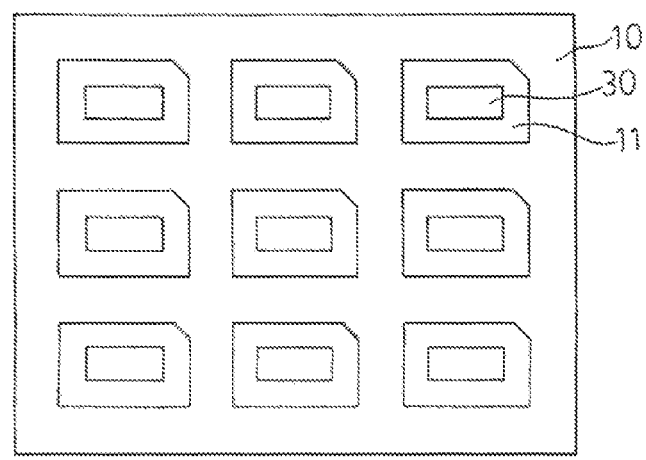
FIG. 9 is a top view of the molds of the present invention after chips are placed therein.
Figure 10:
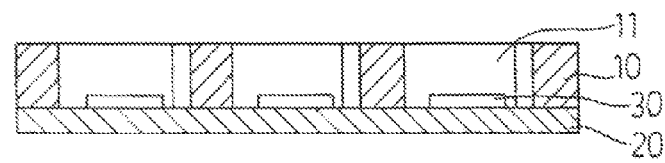
FIG. 10 is a cross-sectional view of the molds of the present invention after chips are placed therein.
Figure 11:
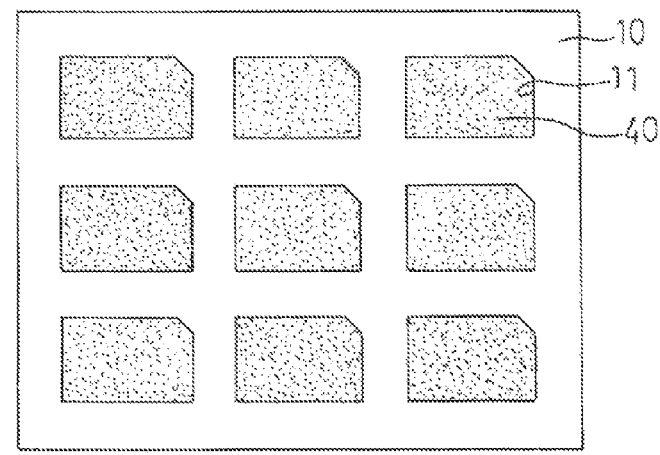
Figure 12:
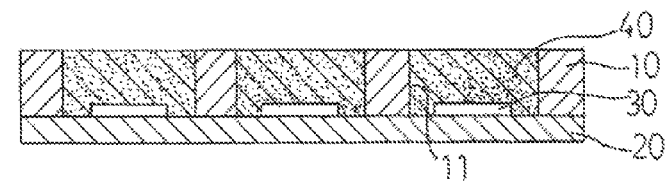
Figure 13:
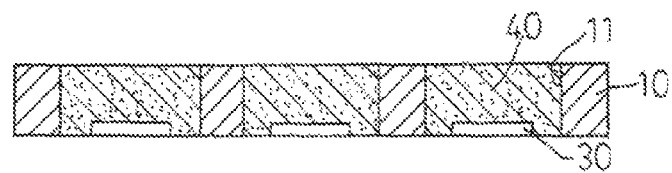
FIG. 13 is a cross-sectional view of the molds of the present invention while the lower mold is separated after the encapsulation gel is cured.
Figure 14:
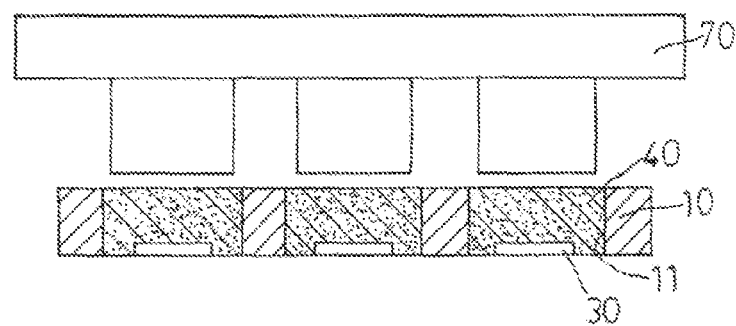
FIG. 14 is a schematic view of the molds of the present invention while molded encapsulation gel therein is being taken out.

Referring to FIGS. 5 to 17, a chip scale LED packaging method according to the present invention includes the following steps: providing an upper mold 10 having a plurality of through holes 11 and a plate-shaped lower mold 20 as shown in FIG. 5; clamping the upper mold 10 and the plate-shaped lower mold 20 together as shown in FIG. 6; allowing the plate-shaped lower mold 20 to be connected to the upper mold 10 to seal the bottoms of the plurality of through holes 11 of the upper mold 10 to form a plurality of bottom-sealed grooves as shown in FIGS. 7 and 8; placing chips 30 in a one by one manner in corresponding ones of the plurality of through holes 11 as shown in FIGS. 9 and 10; pouring encapsulation gel 40 into each of the corresponding through hole 11 as shown in FIGS. 11 and 12; separating the upper mold 10 from the plate-shaped lower mold 20 after the encapsulation gel 40 is cured and molded as shown in FIG.

Figure 15:
FIG. 15 is a top view of a package individual of the present invention.
Figure 16:
FIG. 16 is a cross-sectional view of the package individual of the present invention.
Figure 17:
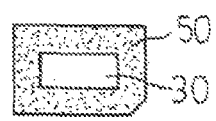
FIG. 17 is a bottom view of the package individual of the present invention.

13; and finally, using a blanking die 70 to separate each cured and molded encapsulation gel 40 from each of the corresponding through holes 11 of the upper mold 10 and taking each of the cured and molded encapsulation get out of each of the corresponding through holes of the upper mold, thereby obtaining individual chip scale packages 50 as shown in FIGS. 15, 16 and 17.

The present invention may use a upper mold 10 with through holes 11 of a different type to match the lower mold 20' thereby making a variety of types of individual packages for optical design use.

The present invention has the following advantages:
1. using different upper and lower molds designs can make a variety of shapes of chip scale LED package individuals for optical design use compared with conventional manufacturing methods, which can only make square or rectangular chip scale LED package individuals.
2. the present invention can control the tolerances of the package individuals more precisely compared to conventional cutting manufacturing processes, and the thickness and exterior dimension of the individual package is the key to control the color temperature and light type of a light emitting individual.
3. each package individual of the present invention is made independently, which will not cause the situation that the whole batch production is scrapped due to some problems such as arrangement or machine setting such that the productivity can be increased relatively.
4. the manufacturing process of the present invention is precise, the facilities simple and the productive efficiency high without cutting tear and wear such that it is suitable for mass production to meet the requirement of a large number of light sources in the market.
5. conventional cutting processes must enlarge or widen the distance of the encapsulation gel of chips, causing the material waste, and the cutting cannot be carried out closely to the chip, thereby avoiding damaging the chip such that the encapsulation gel around the chip is thicker. But, the manufacturing process of the present invention can make ultra-small, ultra-thin package individuals, realizing a real chip scale package (CSP).

I claim:
1. A chip scale light emitting diode (LED) packaging method, comprising the following steps:
   clamping an upper mold having a plurality of through holes and a plate-shaped lower mold together;
   allowing bottoms of said plurality of through holes of said upper mold to be sealed by said plate-shaped lower mold to form a plurality of bottom-sealed grooves that are separated from each other;
   placing a chip in each of said plurality of through holes;
   pouring encapsulation gel into each of said plurality of through holes to enclose each of said chips;
   separating said upper mold from said plate-shaped lower mold after said encapsulation gel is cured and molded; and
   applying a blanking die from tops of said plurality of through holes of said upper mold to simultaneously drive said chips out of said plurality of through holes of said upper mold for separating each said cured and molded encapsulation gel from each of said plurality of through holes of said upper mold and taking each said cured and molded encapsulation gel out of said upper mold to obtain an individual chip scale LED package.

* * * * *